(12) United States Patent
Jung et al.

(10) Patent No.: US 7,514,719 B2
(45) Date of Patent: Apr. 7, 2009

(54) DISPLAY DEVICE

(75) Inventors: Kwang-Chul Jung, Seongnam-si (KR);
Beohm-Rock Choi, Seoul (KR);
Joon-Chul Goh, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 385 days.

(21) Appl. No.: 11/469,712

(22) Filed: Sep. 1, 2006

(65) Prior Publication Data

US 2007/0080417 A1    Apr. 12, 2007

(30) Foreign Application Priority Data

Sep. 15, 2005    (KR) .................. 10-2005-0086309

(51) Int. Cl.
*H01L 27/15*    (2006.01)
(52) U.S. Cl. ...................................... 257/84
(58) Field of Classification Search ............. 257/79–84, 257/184–186
See application file for complete search history.

(56) References Cited

U.S. PATENT DOCUMENTS 5,480,810 A * 1/1996 Wei et al. ................... 438/59

2004/0130516 A1    7/2004 Nathan et al.
2007/0012926 A1 * 1/2007 Hong et al. .................... 257/72

FOREIGN PATENT DOCUMENTS

| CN | 1435804 | 8/2003 |
| KR | 1020020025978 | 4/2002 |
| KR | 1020040093171 | 11/2004 |
| KR | 1020050002606 | 1/2005 |
| WO | 2004-054005 | 6/2004 |

* cited by examiner

*Primary Examiner*—Calvin Lee
(74) *Attorney, Agent, or Firm*—H.C. Park & Associates, PLC

(57) ABSTRACT

The invention provides a display device including an insulating substrate, a photosensor formed on the insulating substrate and including a semiconductor layer, an input terminal and an output terminal electrically connected to the semiconductor layer, a first insulating layer formed on the photosensor, a pixel electrode, an organic layer, and a common electrode layer sequentially formed on the first insulating layer, and a controller that controls an input to the pixel electrode based on an output of the photosensor.

23 Claims, 19 Drawing Sheets

DISPLAY DEVICE

CROSS-REFERENCE TO RELATED APPLICATIONS

This application claims priority from and the benefit of Korean Patent Application No. 10-2005-0086309, filed on Sep. 15, 2005, which is hereby incorporated by reference for all purposes as if fully set forth herein.

BACKGROUND OF INVENTION

1. Field of Invention

The present invention relates to a display device, and more particularly, to a display device including an interlayer insulating layer that may reduce parasitic capacitance.

2. Description of the Background

Generally, among flat panel displays (FPD), organic light emitting displays (OLED) have recently been spotlighted because they may be driven with low voltage, are light and thin, have a wide view angle, and respond at high speed. OLEDs may be passive matrix or active matrix according to their driving method. Passive matrix OLEDs may be manufactured through relatively simple processes, however, their power consumption may rapidly increase as display area and resolution increase. Therefore, passive matrix OLEDs are typically used as smaller displays. On the other hand, active matrix OLEDs may be manufactured through relatively complicated processes, however, they may have large screens and high resolution.

In active matrix OLEDs, thin film transistors (TFT) are included in each pixel region to control emission of the pixel's organic light emitting layer. A pixel electrode is provided in each pixel region and is electrically separated from adjacent pixel electrodes so that it may be independently driven. A wall, which is higher than the pixel electrode, is formed between pixel regions. The wall prevents pixel electrodes from shorting with each other, and it separates pixel regions from each other. A hole injecting layer and an organic light emitting layer may be sequentially formed on the pixel electrode between walls.

A plurality of transistors may be arranged in one pixel in an OLED. In general, the pixel may include a switching transistor connected to a data line and a driving transistor connected to a driving voltage line. With such a complicated structure, parasitic capacitance may be generated between wiring line layer, thereby deteriorating the display's quality.

SUMMARY OF THE INVENTION

The present invention provides a display device that may be capable of reducing parasitic capacitance.

Additional features of the invention will be set forth in the description which follows, and in part will be apparent from the description, or may be learned by practice of the invention.

The present invention discloses a display device including a substrate, and a photosensor arranged on the substrate. The photosensor includes a semiconductor layer, an input terminal electrically connected to the semiconductor layer, and an output terminal electrically connected to the semiconductor layer. A first insulating layer is arranged on the photosensor, a pixel electrode, an organic layer, and a common electrode layer are sequentially arranged on the first insulating layer, and a controller controls an input to the pixel electrode based on an output of the photosensor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

Figure 1:
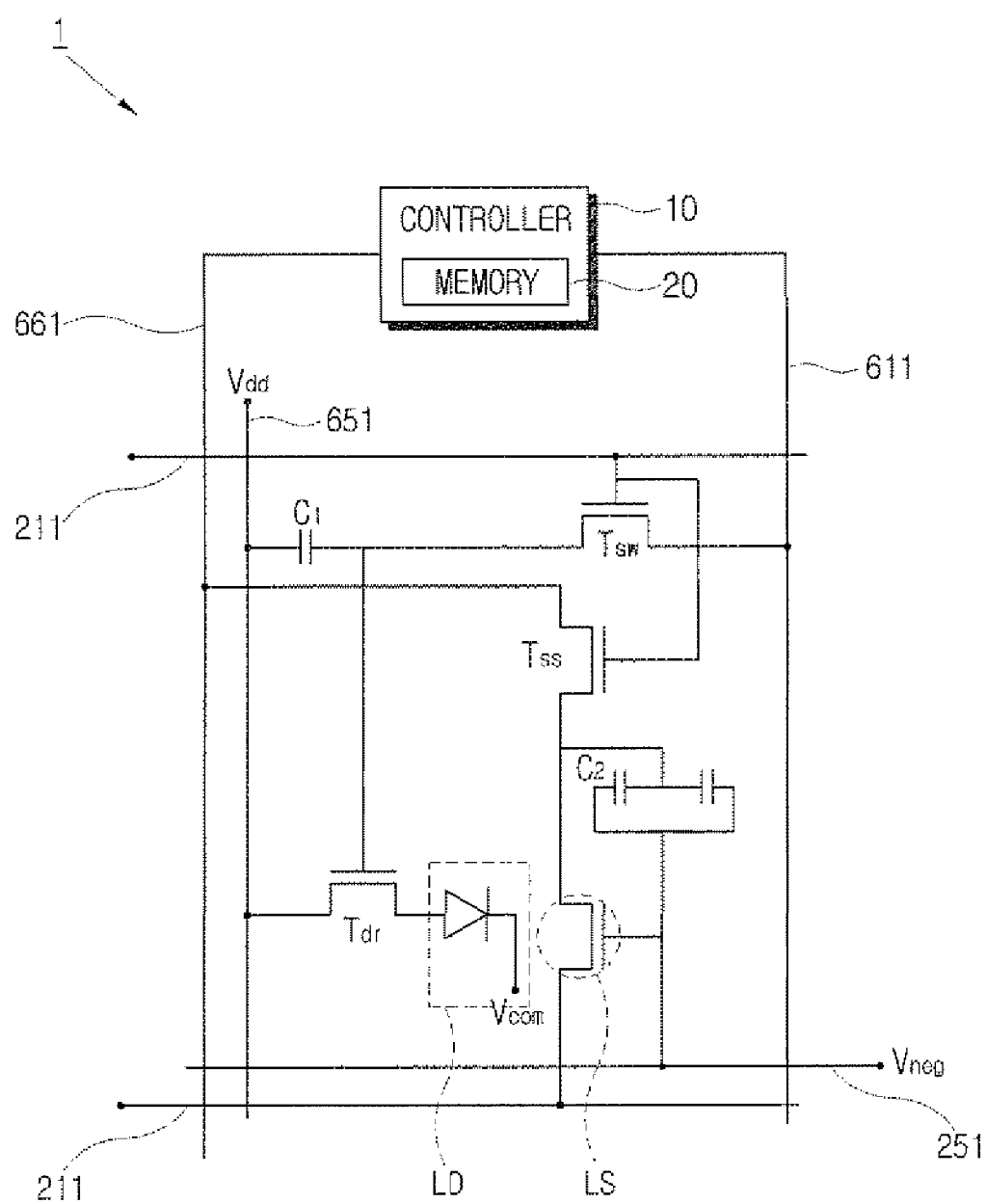
FIG. 1 is an equivalent circuit diagram of a display device according to a first exemplary embodiment of the present invention.

DETAILED DESCRIPTION OF THE ILLUSTRATIVE, NON-LIMITING EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is an equivalent circuit diagram of a display device according to a first exemplary embodiment of the present invention.

Referring to FIG. 1, a display device 1 according to the present embodiment includes a plurality of signal lines 211, 251, 611, 651, and 661.

The signal lines include a gate line 211 for transmitting a scan signal, a negative electrode line 251 for transmitting a negative voltage, a data line 611 for transmitting a data signal, a driving voltage line 651 for transmitting a driving voltage, and a sensor line 661 connected to a photosensor LS.

Each pixel includes an organic light emitting diode (LD), a switching transistor Tsw, a driving transistor Tdr, a sensor transistor Tss, a photosensor LS, and capacitors C1 and C2.

The driving transistor Tdr includes a control terminal, an input terminal, and an output terminal. The control terminal is connected to the switching transistor Tsw, the input terminal is connected to the driving voltage line 651, and the output terminal is connected to the organic light emitting diode LD.

The organic light emitting diode LD includes an anode, which is connected to the output terminal of the driving transistor Tdr, and a cathode, which is connected to a common voltage Vcom. The organic light emitting diode LD displays an image by emitting light having an intensity that varies in accordance with the output current of the driving transistor Tdr. The magnitude of the current output by the driving transistor Tdr corresponds to the voltage applied between its control terminal and input terminal.

The switching transistor Tsw also includes a control terminal, an input terminal, and an output terminal. The control terminal is connected to the gate line 211, the input terminal is connected to the data line 611, and the output terminal is connected to the control terminal of the driving transistor Tdr. The switching transistor Tsw transmits the data signal from the data line 611 to the driving transistor Tdr in accordance with the scan signal from the gate line 211.

The capacitor C1 is connected between the control terminal and the input terminal of the driving transistor Tdr. The capacitor C1 charges and maintains the data signal input to the control terminal of the driving transistor Tdr.

The switching transistor Tsw and the driving transistor Tdr may deteriorate while being driven. The sensor transistor Tss, the photosensor LS, the capacitor C2, and the negative electrode line 251 may compensate for this deterioration.

The sensor transistor Tss includes a control terminal, an input terminal, and an output terminal. The control terminal is connected to the gate line 211, the input terminal is connected to the sensor line 661, and the output terminal is connected to the photosensor LS and the capacitor C2.

The capacitor C2 is connected between the output terminal of the sensor transistor Tss and the negative electrode line 251. The capacitor C2 charges and maintains the voltage input to the input terminal of the photosensor LS.

The photosensor LS includes a semiconductor layer, an input terminal connected to one end of the semiconductor layer and the output terminal of the sensor transistor Tss, and an output terminal connected to the other end of the semiconductor layer and the next gate line 211.

The resistance of the semiconductor layer of the photosensor LS decreases when receiving light from the organic light emitting diode LD, thereby permitting current to flow. Therefore, when light is incident on the semiconductor layer, current may flow from the input terminal to the output terminal of the photosensor LS. Hence, the charge capacitance of the capacitor C2 may decrease. As the intensity of the incident light increases, the amount of current that flows to the output terminal increases so that reduction in the capacitance of the capacitor C2 increases. Therefore, more current is supplied through the sensor line 661.

Although the same data voltage may be applied, the intensity of the light incident on the semiconductor layer may be reduced (or increased) corresponding to the degree to which the switching transistor Tsw and the driving transistor Tdr deteriorate.

It is noted from the above that the deterioration of the switching transistor Tsw and the driving transistor Tdr, the intensity of the light from the organic light emitting diode LD incident on the semiconductor layer, the magnitude of the current that flows to the output terminal of the photosensor LS, the reduction in the capacitance of the capacitor C2, and the amount of current supply of the sensor line 661 for compensating for the reduction in the capacitance of the capacitor C2 are related to each other.

A controller 10 controls the data voltage supplied to the data line 611 based on the amount of current supplied through the sensor line 661. Therefore, the deterioration of the switching transistor Tsw and the driving transistor Tdr may be compensated for.

A table of the values of the currents supplied through the sensor line 661 in accordance with the magnitudes of the data voltages is stored in a memory 20 connected to the controller 10. The controller 10 compensates for the deterioration of the switching transistor Tsw and the driving transistor Tdr with respect to various data voltages using stored values of the memory 20.

The structure of the display device of FIG. 1 will be described in detail below with reference to FIG. 2, FIG. 3, and FIG. 4.

Figure 2:
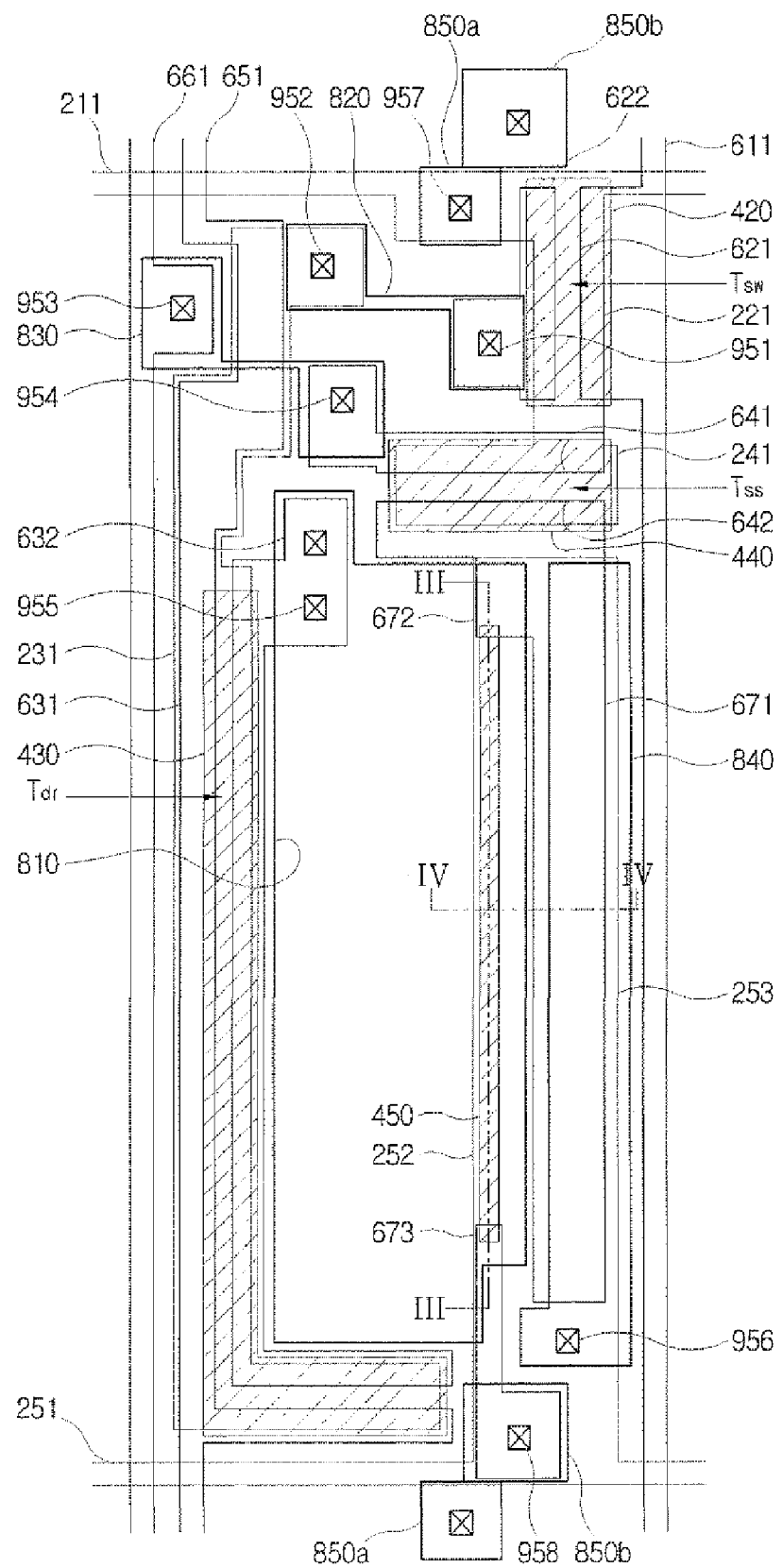
FIG. 2 is a plan view of the display device according to the first exemplary embodiment of the present invention.

FIG. 2 is a plan view of the display device according to the first exemplary embodiment of the present invention. FIG. 3 is a sectional view taken along line III-III of FIG. 2, and FIG. 4 is a sectional view taken along line IV-IV of FIG. 2.

Figure 3:
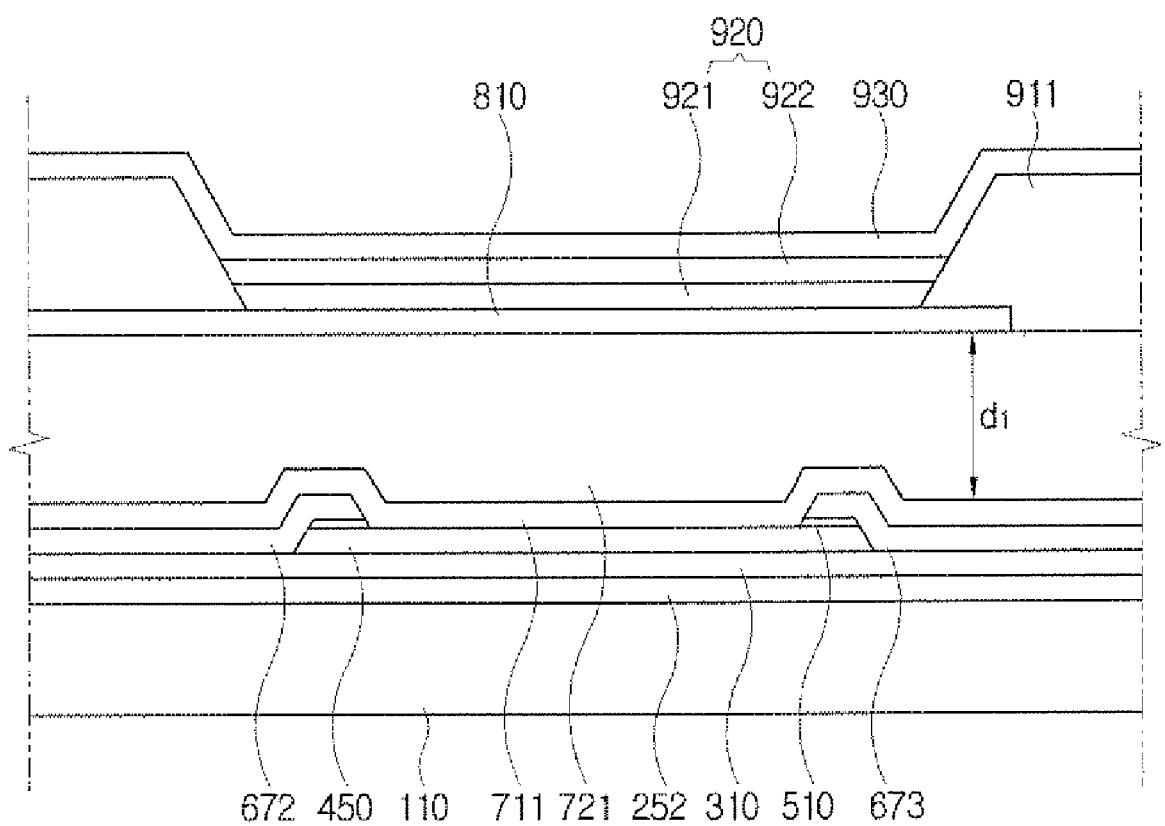
FIG. 3 is a sectional view taken along line III-III of FIG. 2.
Figure 4:
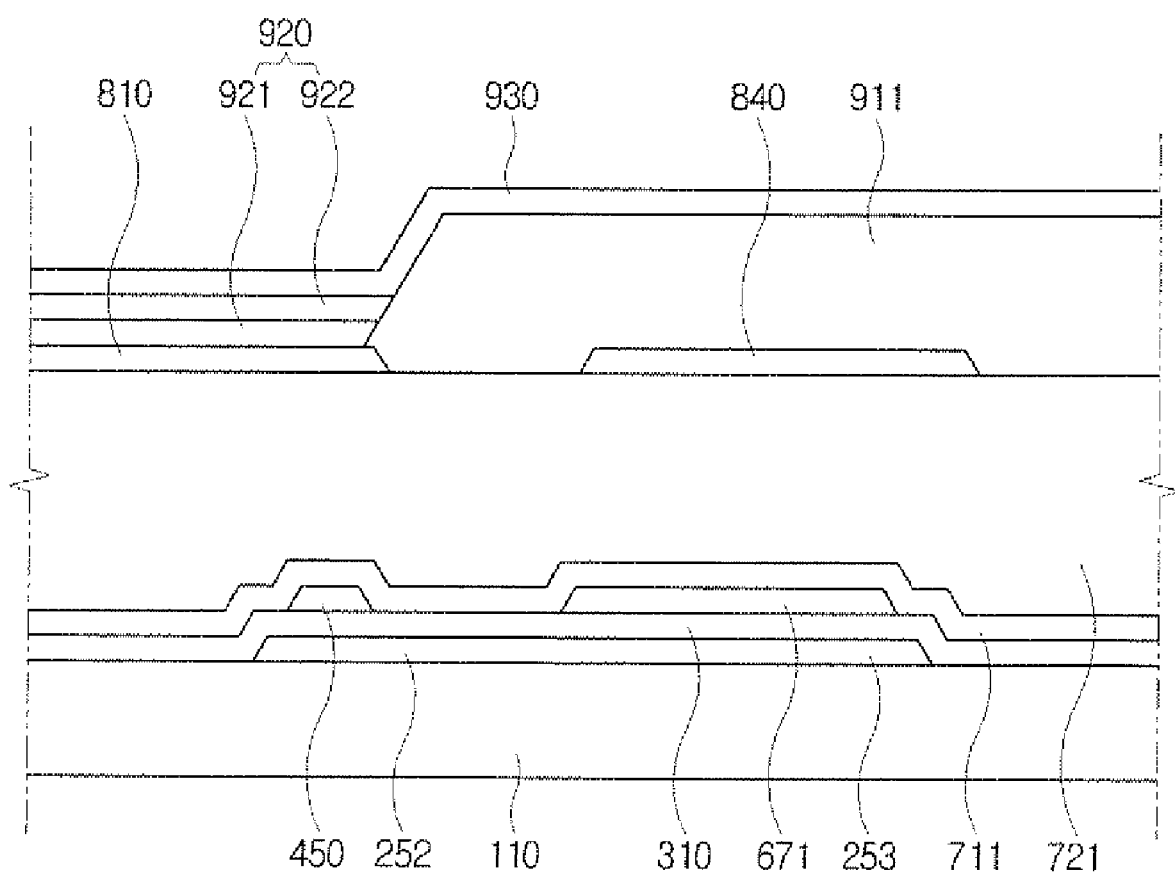
FIG. 4 is a sectional view taken along line IV-IV of FIG. 2.

Referring to FIG. 2, FIG. 3, and FIG. 4, a gate wiring line including the gate line 211, a switching gate electrode 221, a driving gate electrode 231, a sensor gate electrode 241, a negative electrode line 251, a light shielding unit 252, and a gate capacitor forming unit 253 is formed on an insulating substrate 110, which may be made of transparent glass. The gate wiring line is made of a metal layer that may include one or more multiple layers. Among the above, the gate lines 211, the switching gate electrode 221, and the sensor gate electrode 241 may be integrally formed with each other. The negative electrode line 251, the light shielding unit 252, and the gate capacitor forming unit 253 may be integrally formed with each other.

The gate lines 211 transmit the scan signals, and they are mainly horizontally arranged to cross with the data lines 611. The gate lines 211 may have wide ends (not shown) to be connected to another layer or an external device. When a gate driving circuit (not shown) for generating the scan signals is integrated with the insulating substrate 110, the gate line 211 may be directly connected to the gate driving circuit. The switching gate electrode 221 and the sensor gate electrode 241 are connected to the gate line 211 and operate as the control terminal of the switching transistor Tsw and the sensor transistor Tss, respectively.

The driving gate electrode 231 of the driving transistor Tdr is connected to the switching drain electrode 622 of the switching transistor Tsw, and it forms the capacitor C1 together with a switching source electrode 621.

The negative electrode line 251 is adjacent and substantially parallel to the gate line 211. A negative voltage, for example, −5V or −10V, is applied to the negative electrode line 251.

The light shielding unit 252 is connected to the negative electrode line 251, and it is arranged under the photosensor LS to prevent external light from being incident on the photosensor's semiconductor layer 450. Therefore, the photosensor LS may be irradiated with only the light from the organic light emitting diode LD due to the light shielding unit 252. Since negative voltage is applied to the light shielding unit 252, the light shielding unit 252 prevents the photosensor semiconductor layer 450 positioned with interposing a gate insulating layer 310 therebetween from being activated.

The gate capacitor forming unit 253 is connected to the negative electrode line 251. It forms the capacitor C2 together with a data capacitor forming unit 671, which is connected to the sensor drain electrode 642 of the sensor transistor Tss. The data capacitor forming unit 671 forms the capacitor C2 together with a transparent electrode capacitor forming unit 840, which is connected to the negative electrode line 251. In other words, the gate capacitor forming unit 253, the data capacitor forming unit 671, and the transparent electrode capacitor forming unit 840 are sequentially arranged so that the capacitor C2 is formed between the gate capacitor forming unit 253 and the data capacitor forming unit 671 and between the data capacitor forming unit 671 and the transparent electrode capacitor forming unit 840.

The gate insulating layer 310, which may be made of silicon nitride SiNx, is formed on the insulating substrate 110 and the gate wiring line.

A semiconductor layer made of amorphous silicon is formed on the gate insulating layer 310. The semiconductor layer includes a switching semiconductor layer 420 in the switching transistor Tsw, a driving semiconductor layer 430 in the driving transistor Tdr, a sensor semiconductor layer 440 in the sensor transistor Tss, and the photosensor semiconductor layer 450 in the photosensor LS. The switching semiconductor layer 420 and the sensor semiconductor layer 440 are island-shaped, and the driving semiconductor layer 430 extends along the driving gate electrode 231. The photosensor semiconductor layer 450 is band-shaped to run substantially parallel with the data lines 611 and is completely covered by the light shielding unit 252.

An ohmic contact layer 510, which may be made of n+ hydrogenated amorphous silicon highly doped with n-type impurities, is arranged between the semiconductor layer and a data wiring line.

The data wiring line is formed on the ohmic contact layer 510 and the gate insulating layer 310 that is not covered by the ohmic contact layer 510.

The data wiring line includes the data lines 611, the switching source electrode 621, the switching drain electrode 622, a driving voltage line 651, a driving source electrode 631, a driving drain electrode 632, a sensor source electrode 641, a sensor drain electrode 642, the data capacitor forming unit 671, an input terminal 672, an output terminal 673, and the sensor line 661. The data line 611 and the switching source electrode 621 may be integrally formed with each other, the driving voltage line 651 and the driving source electrode 631 may be integrally formed with each other, and the sensor drain electrode 642, the data capacitor forming unit 671, and the input terminal 672 may be integrally formed with each other.

The data lines 611, which transmit data signals, are mainly vertically extended to cross with the gate lines 211. They may have wide ends (not shown) to be connected to another layer or an external device. When a data driving circuit (not shown) for generating the data signals is integrated with the insulating substrate 110, the data lines 611 may be directly connected to the data driving circuit. The switching source electrode 621 may be integrally formed with the data line 611, and it operates as the input terminal of the switching transistor Tsw.

The switching drain electrode 622 of the switching transistor Tsw is connected to the driving gate electrode 231 of the driving transistor Tdr.

The driving voltage line 651 runs substantially parallel with the data line 611 to apply a driving voltage to the driving source electrode 631 of the driving transistor Tdr. The driving source electrode 631 extends from the driving voltage line 651.

The driving drain electrode 632 runs substantially parallel with the driving source electrode 631 at a predetermined distance and outputs current to a pixel electrode 810.

The sensor source electrode 641 of the sensor transistor Tss is connected to the sensor line 661. The sensor line 661 supplies a predetermined voltage, for example, 5V to the sensor source electrode 641. The sensor drain electrode 642 may be integrally formed with the input terminal 672 of the photosensor LS and the data capacitor forming unit 671. The input terminal 672 is connected to one end of the photosensor semiconductor layer 450, and the data capacitor forming unit 671 forms the capacitor C2 together with the gate capacitor forming unit 253 and the transparent electrode capacitor forming unit 840.

The output terminal 673 is island-shaped, and it is connected to the other end of the photosensor semiconductor layer 450 and to the next gate line 211. The current that flows to the output terminal 673 of the photosensor LS may be discharged to the next gate line 211.

The sensor line 661 runs substantially parallel with the data line 611 to apply a predetermined voltage to the sensor source electrode 641 of the sensor transistor Tss. One end of the sensor transistor Tss may be connected to the controller 10.

A passivation layer 711 is formed on the data wiring lines and the semiconductor layer that is not covered by the data wiring lines. The passivation layer 711 may be formed of a material such as silicon nitride SiNx.

An interlayer insulating layer 721 is formed on the passivation layer 711. The interlayer insulation layer 721 may be a low dielectric material with a dielectric constant less tan or equal to 4, and it may be made of fluorine-doped silicon oxide (SiOF), silicon oxycarbide (SiOC), and an organic material. SiOF and SiOC may be formed by a plasma enhanced chemical vapor deposition (PECVD) method, and the organic material may be formed by a spin coating method and a slit coating method. The organic material may be one of benzocyclobutene (BCB), olefin, acrylic resin, polyimide, and fluoropolymer such as polytetrafluoroethylene (PTFE), perfluorocyclobutane (PFCB), fluorinated ethylene propylene (FEP), poly fluoro alkoxy (PFA), ethylene tetra fluoro ethylene (ETFE) and polyvinylidene fluoride (PVDF). The fluoropolymer may have structural formula 1 which is known as cytop (trademark) produced by Asahi Glass, Japan. A photosensitive organic insulating material may be used as the interlayer insulating layer 721.

Structural Formula 1:

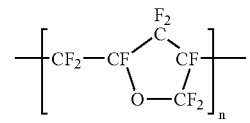

The thickness d1 of the interlayer insulating layer 721 may be 1 μm to 5 μm. When the thickness d1 of the interlayer insulating layer 721 is less than 1 μm, the performance of the photosensor LS may deteriorate due to electrical interference of the pixel electrode 810. When the thickness d1 of the interlayer insulating layer 721 is larger than 5 μm, the formation of the contact holes 951 through 958 may become difficult.

A transparent electrode layer 800 is formed on the interlayer insulating layer 721. The transparent electrode layer 800 includes the pixel electrode 810, a driving bridge 820, a sensor bridge 830, the transparent electrode capacitor forming unit 840, and a photosensor bridge 850a and 850b. The transparent electrode layer 800 may be made of a transparent conductive material such as indium tin oxide (ITO) and indium zinc oxide (IZO).

The pixel electrode 810 may be an anode, and it supplies holes to an organic layer 920. The pixel electrode 810 is arranged on the photosensor semiconductor layer 450, and it is connected to the driving drain electrode 632 through the contact hole 955.

The driving bridge 820 connects the switching drain electrode 622 of the switching transistor Tsw and the driving gate electrode 231 of the driving transistor Tdr to each other. Therefore, the switching drain electrode 622 and the driving gate electrode 231 are exposed through contact holes 951 and 952, respectively.

The sensor bridge 830 connects the sensor line 661 and the sensor source electrode 641 of the sensor transistor Tss to each other. Therefore, the sensor line 661 and the sensor source electrode 641 are exposed through contact holes 953 and 954, respectively.

The transparent electrode capacitor forming unit 840 is connected to the gate capacitor forming unit 253 to form the capacitor C2 together with the data capacitor forming unit 671. Therefore, the gate capacitor forming unit 253 is exposed through contact hole 956.

The photosensor bridge 850a and 850b connects the next gate line 211 and the output terminal 673 of the photosensor LS to each other. Therefore, the next gate line 211 and the output terminal 673 are exposed through contact holes 957 and 958, respectively.

A wall 911 is formed between adjacent pixel electrodes 810. The wall 911 separates the pixel electrodes 810 from each other to define a pixel region, and it is formed on the thin film transistors (TFT) Tsw. Tdr, and Tss. The wall 911 may be made of a heat and solvent resistant photosensitive material such as acrylic resin and polyimide resin and an inorganic material such as $SiO_2$ and $TiO_2$. The wall 911 may have a double layer structure including an organic layer and an inorganic layer.

The organic layer 920 is formed on the pixel electrode 810 where it is not covered by the walls 911. The organic layer 920 may include a hole injecting layer 921 and a light emitting layer 922.

The hole injecting layer 921 may be made of hole injecting materials such as poly(3,4-ethylenedioxythiophene) (PEDOT) and polystyrene sulfonic acid (PSS). The hole injecting materials are mixed with each other to be suspended to form the hole injecting layer 921 by an inkjet method.

The light emitting layer 922 may be obtained by doping perylene based pigment, rhodamine based pigment, rubrene, perylene, 9,10-diphenylanthracene, tetraphenylbutadiene, Nile red, coumarine 6, quinacridone on polyfluorene derivative, (poly)paraphenylenevinylene derivative, polyphenylene derivative, polyvinylcarbazole, polythiophene derivative, or a polymer material of the above.

The holes transmitted from the pixel electrodes 810 and the electrons transmitted from a common electrode 930 combine with each other in the light emitting layer 922 to become excitons and generate light as their energy level decreases.

The common electrode 930 is positioned on the walls 911 and the light emitting layer 922. The common electrode 930 may be a cathode, and it supplies electrons to the light emitting layer 922. The common electrode 930 may be obtained by laminating a calcium layer and an aluminum layer. In this case, the layer having a low work function may be arranged on the side close to the light emitting layer 922. The common electrode 930 directly contacts the light emitting layer 922 to inject electrons.

Alternatively, since lithium fluoride increases emission efficiency in accordance with the material of the light emitting layer 922, a lithium fluoride layer may be formed between the light emitting layer 922 and the common electrode 930. When the common electrode 930 is made of an opaque material such as aluminum and silver, the light generated by the light emitting layer 922 may be emitted to the insulating substrate 110, which is referred to as a bottom emission method.

The above-described pixel electrode 810, the organic layer 920, and the common electrode 930 constitute the organic light emitting diode LD of FIG. 1.

Although not shown, the display device 1 may further include an electron transfer layer and an electron injecting layer between the light emitting layer 922 and the common electrode 930. Also, the display device 1 may further include a passivation layer for protecting the common electrode 930 and a sealing member for preventing moisture and air from penetrating the organic layer 920. The sealing member may include a sealing resin and a sealing can.

The operation of the photosensor LS will be described in detail below with reference to FIG. 1, FIG. 2, FIG. 3, and FIG. 4.

When a gate-on voltage is applied through the gate line 211, the switching transistor Tsw and the sensor transistor Tss are turned on.

The capacitor C2 is charged through the sensor line 661 and the sensor bridge 830 when the sensor transistor Tss is turned on.

When the switching transistor Tsw is turned on, a data voltage applied through the data line 611 is transmitted to the switching drain electrode 622. The data voltage is applied to the driving gate electrode 231 of the driving transistor Tdr through the driving bridge 820 so that the driving transistor Tdr may be turned on.

Driving current is applied to the driving drain electrode 632 through the turned on driving transistor Tdr. The magnitude of the driving current corresponds to the data voltage. The driving current applied to the driving drain electrode 632 is applied to the pixel electrode 810 so that the organic layer 920 may be emitted.

The light emitted from the organic layer 920 activates the photosensor semiconductor layer 450 so that current may flow from the input terminal 672 to the output terminal 673. Therefore, the capacitance of the capacitor C2 may be reduced. The controller 10 controls the data voltage based on the amount of current supplied to charge the capacitor C2 again. The current that flows to the output terminal 673 may be discharged to the next gate line 211 through the photosensor bridge 850a and 850b.

According to the above-described first exemplary embodiment, the interlayer insulating layer 721 is formed between the transparent electrode layer 800 and the gate wiring line and between the transparent electrode layer 800 and the data wiring line. Since the interlay insulating layer 721 has a low dielectric constant and a thickness of 1 µm to 5 µm, the parasitic capacitance of the interlayer insulating layer 721 may be reduced between the transparent electrode layer 800 and the gate wiring line and between the transparent electrode layer 800 and the data wiring line so that the quality of the display device 1 may be improved.

As shown in FIG. 2, the input terminal 672 and the output terminal 673 of the photosensor LS may be connected to the both ends of the photosensor semiconductor layer 450. The light shielding unit 252 is positioned under the photosensor semiconductor layer 450, and the gate insulating layer 310 is interposed therebetween. In such a structure, the photosensor semiconductor layer 450, the input terminal 672, the output terminal 673, and the light shielding unit 252 may form a TFT. In this case, it is difficult to control the flow of current of the photosensor semiconductor layer 450, which makes it difficult for the photosensor LS to measure the intensity of light from the light emitting layer 922. However, this problem may be solved by applying a negative voltage to the light shielding unit 252.

On the other hand, the pixel electrode 810 is formed on the photosensor semiconductor layer 450, and the passivation layer 711 and the interlay insulating layer 721 are interposed therebetween. In such a structure, the photosensor semiconductor layer 450, the input terminal 672, the ouput terminal 673, and the pixel electrode 810 may form a TFT. In this case, it is difficult to control the flow of current of the photosensor semiconductor layer 450, which makes it difficult for the photosensor LS to measure the intensity of light from the light emitting layer 922. However, since the interlayer insulating layer 721 has a low dielectric constant and is relatively thick, it is possible to prevent this TFT from forming.

According to such a structure, the photosensor LS may measure the intensity of light from the light emitting layer 922 without being substantially affected by the light shielding unit 252 thereunder and the pixel electrode 810 thereon.

A method of manufacturing the display device according to the first exemplary embodiment of the present invention will be described below with reference to FIGS. 5A to 11B. FIGS. 5A, 6A, 7A, 8A, 9A, 10A, and 11A are sectional views taken along line III-III of FIG. 2, and FIGS. 5B, 6B, 7B, 8B, 9B, 10B, and 11B are sectional views taken along line IV-IV of FIG. 2.

Figure 5A:
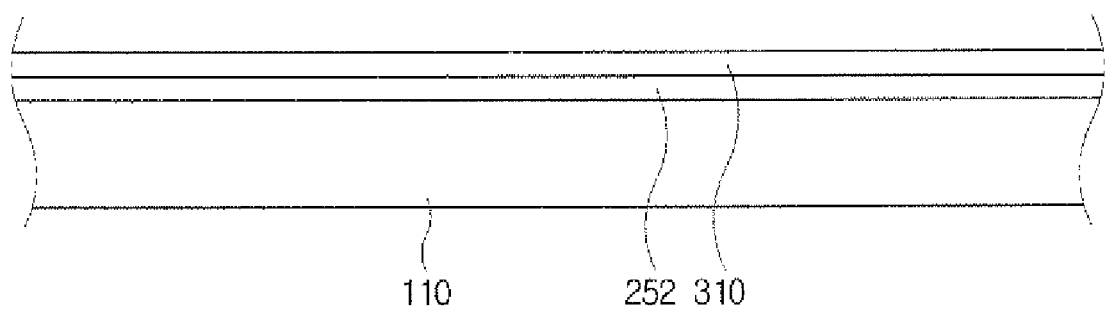
FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, and FIG. 11B are sectional views sequentially illustrating a method of manufacturing the display device according to the first exemplary embodiment of the present invention.
Figure 5B:
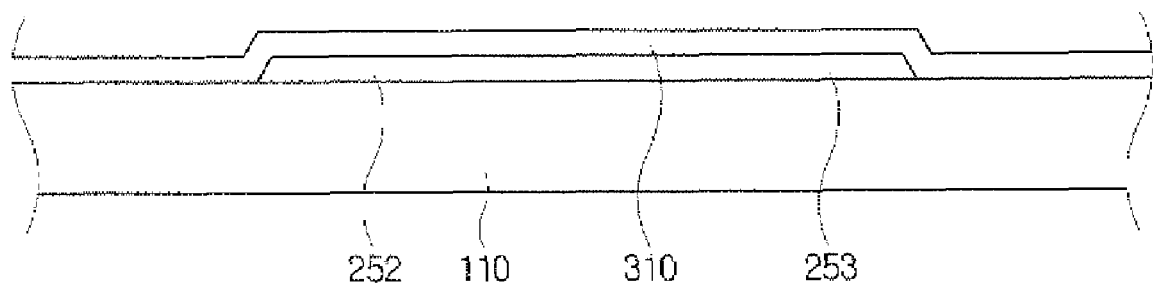

First, as illustrated in FIG. 5A and FIG. 5B, a gate metal layer may be formed on the insulating substrate 110 and patterned to form the light shielding unit 252 and the gate capacitor forming unit 253. The gate metal layer may be formed on the entire surface of the insulating substrate 110 by a sputtering method. Then, the gate insulating layer 310 may be formed on the light shielding unit 252 and the gate capacitor forming unit 253. The gate insulating layer 310 may be formed of silicon nitride (SiNx) by the CVD method.

Figure 6A:
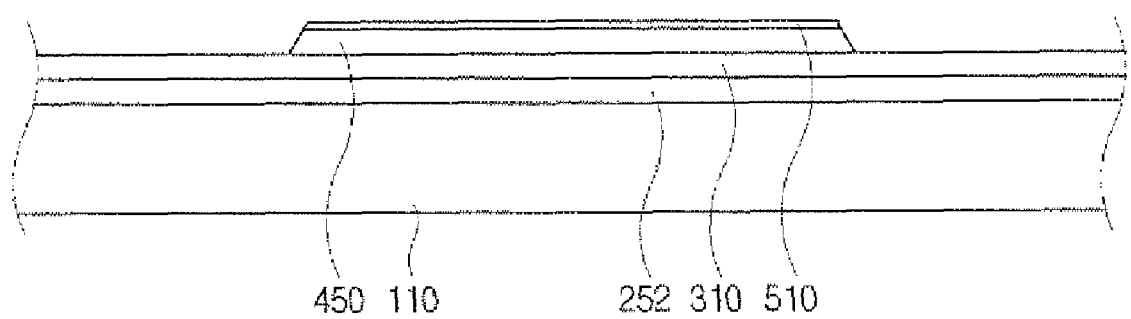
Figure 6B:
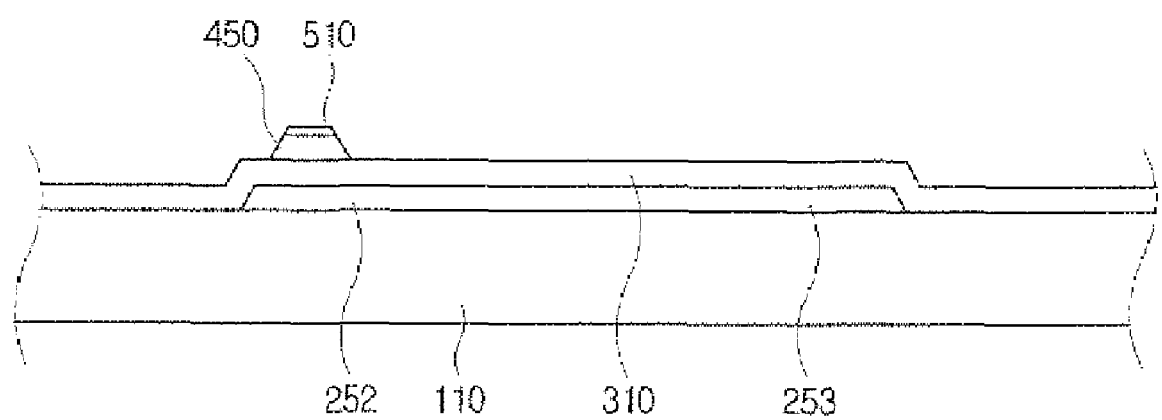

Next, as illustrated in FIG. 6A and FIG. 6B, the island-shaped photosensor semiconductor layer 450 and ohmic contact layer 510 may be formed on the gate insulating layer 310. The gate insulating layer 310, the photosensor semiconductor layer 450, and the ohmic contact layer 510 may be continuously formed.

Figure 7A:
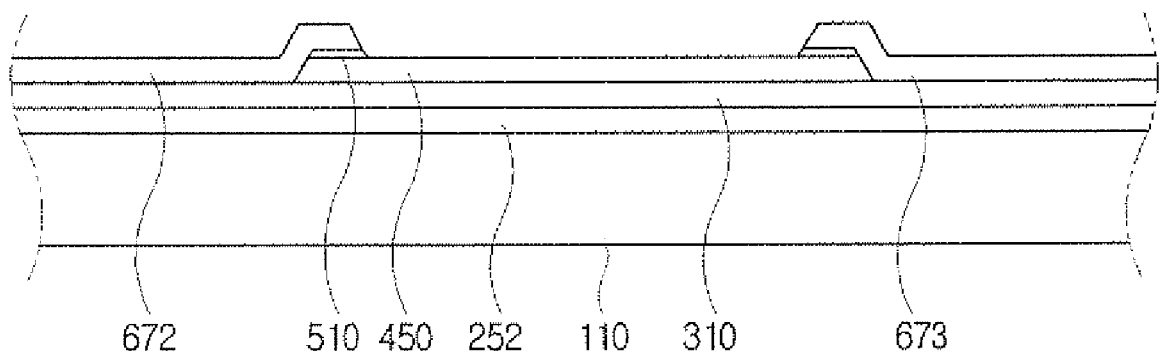
Figure 7B:
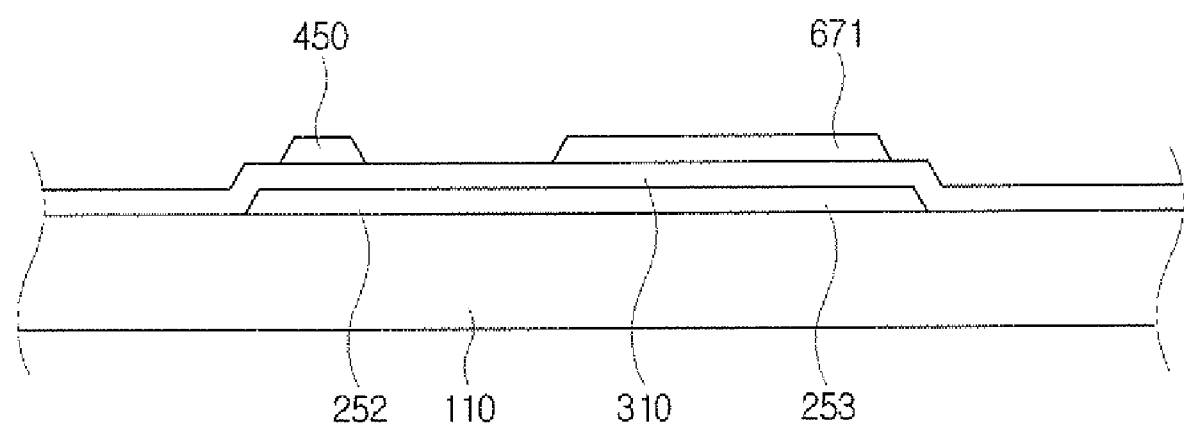

Next, as illustrated in FIG. 7A and FIG. 7B, a data metal layer may be formed and patterned to form the data capacitor forming unit 671, the input terminal 672, and the output terminal 673. The data capacitor forming unit 671 and the input terminal 672 may be integrally formed with each other. The data metal layer may be formed on the entire surface of the insulating substrate 110 by the sputtering method. In such a process, the ohmic contact layer 510 that is not covered by the input terminal 672 and the output terminal 673 is removed. After removing the ohmic contact layer 510, oxygen plasma may be performed in order to stabilize the surface of the exposed photosensor semiconductor layer 450. The ohmic contact layer 510 may be etched by a dry etching method using plasma.

Figure 8A:
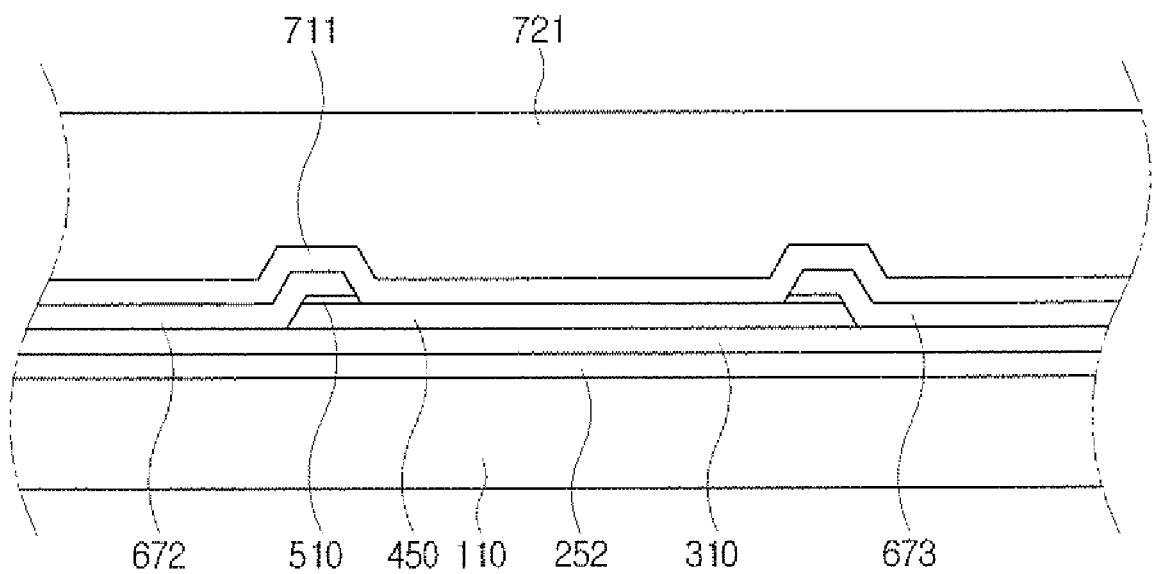
Figure 8B:
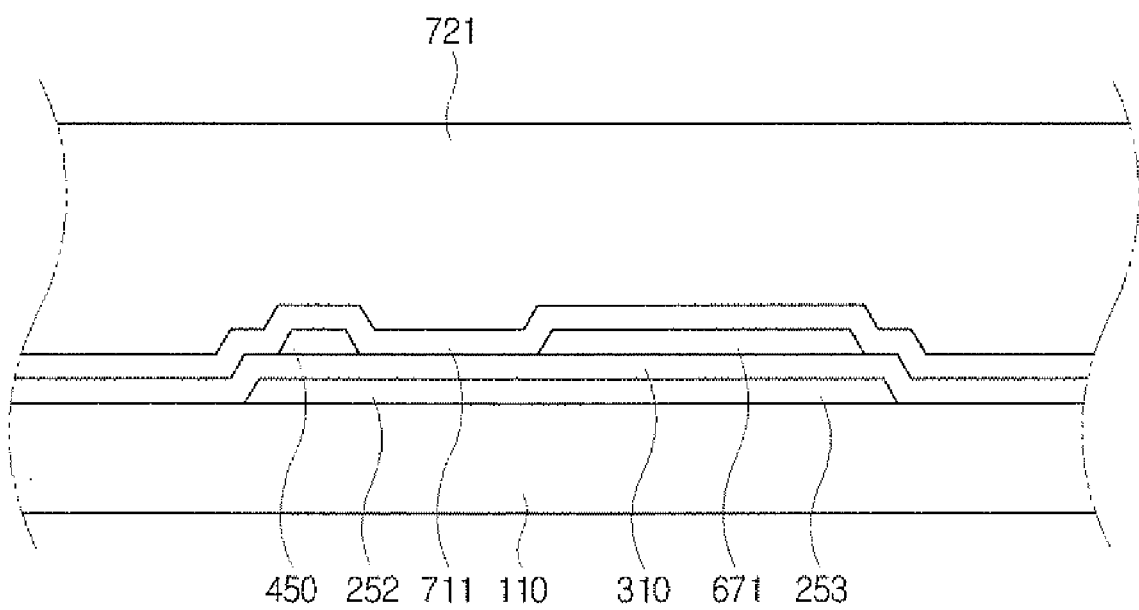

Next, as illustrated in FIG. 8A and FIG. 8B, the passivation layer 711 and the interlayer insulating layer 721 may be formed. The passivation layer 711 may be made of silicon nitride by the CVD method. The interlayer insulating layer 721 may be formed of SiOF and SiOC by the PECVD method and an organic material by the spin coating method and the slit coating method.

Figure 9A:
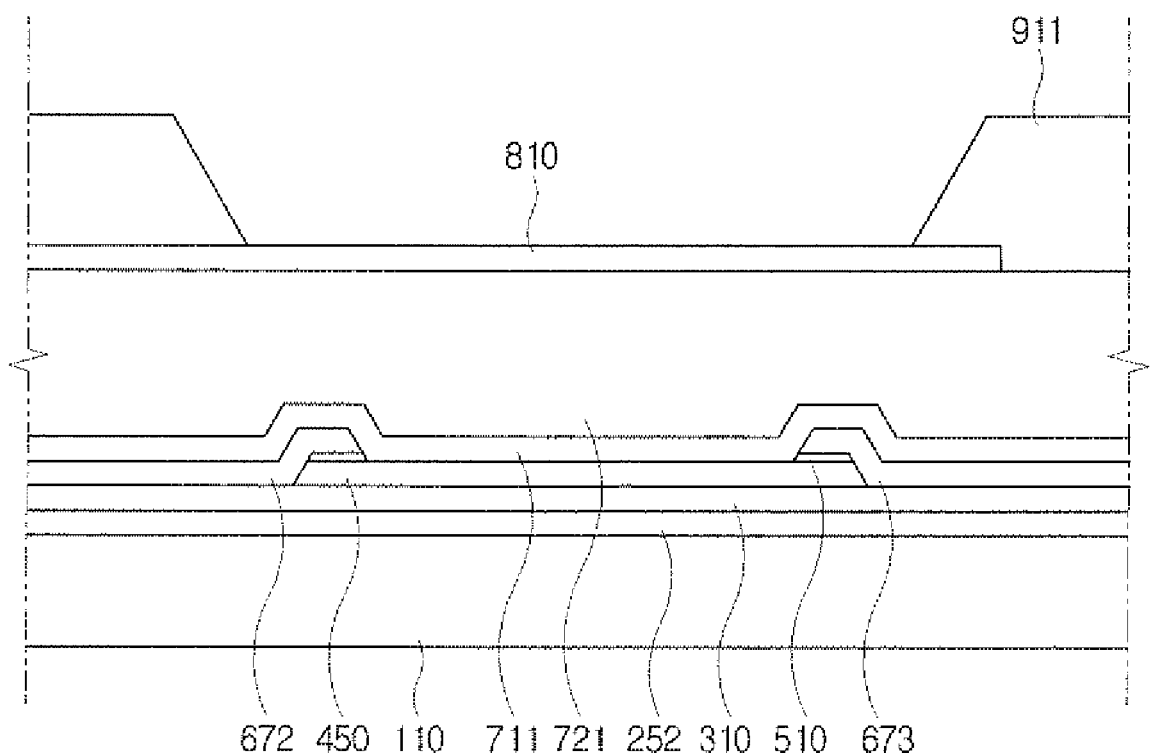
Figure 9B:
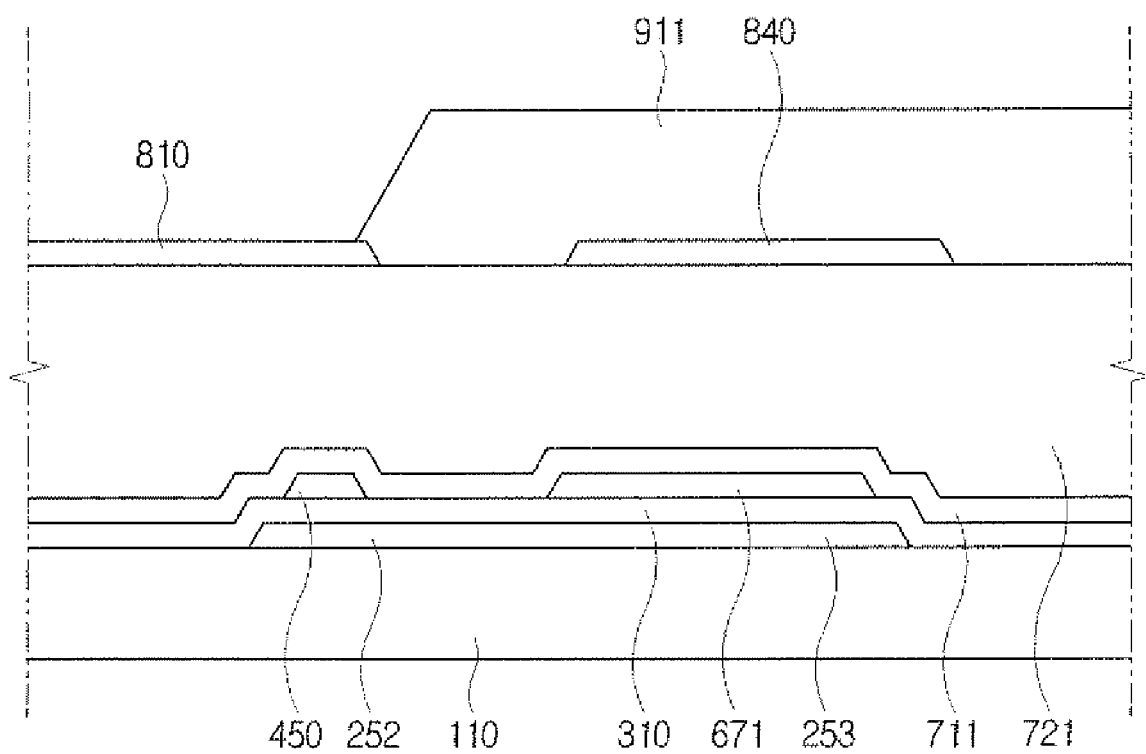

Next, as illustrated in FIG. 9A and FIG. 9B, a transparent conductive layer such as ITO or IZO may be deposited and etched using photolithography to form the pixel electrode 810 and the transparent electrode capacitor forming unit 840. Nitrogen may be used for a pre-heating process before laminating ITO or IZO. Then, a wall material layer may be formed on the entire surface and exposed to form the walls 911. The wall material layer may be formed of a photosensitive material by the slit coating method or the spin coating method.

Figure 10A:
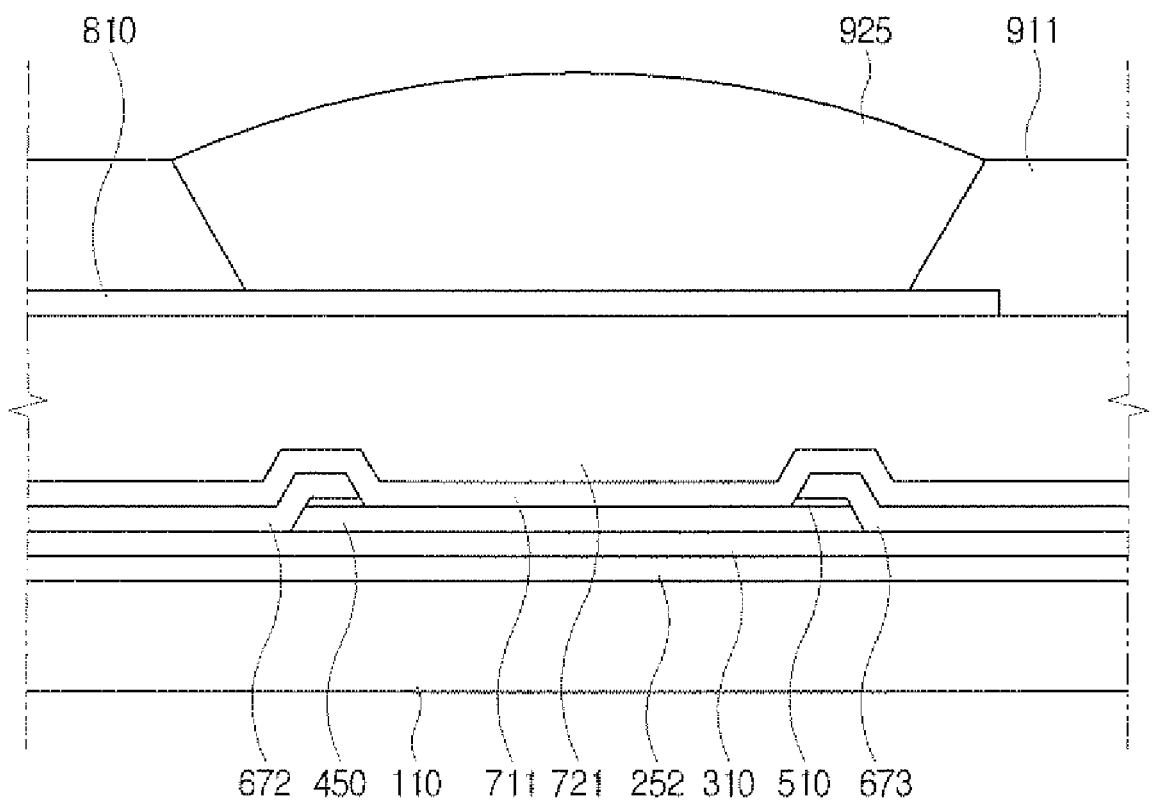
Figure 10B:
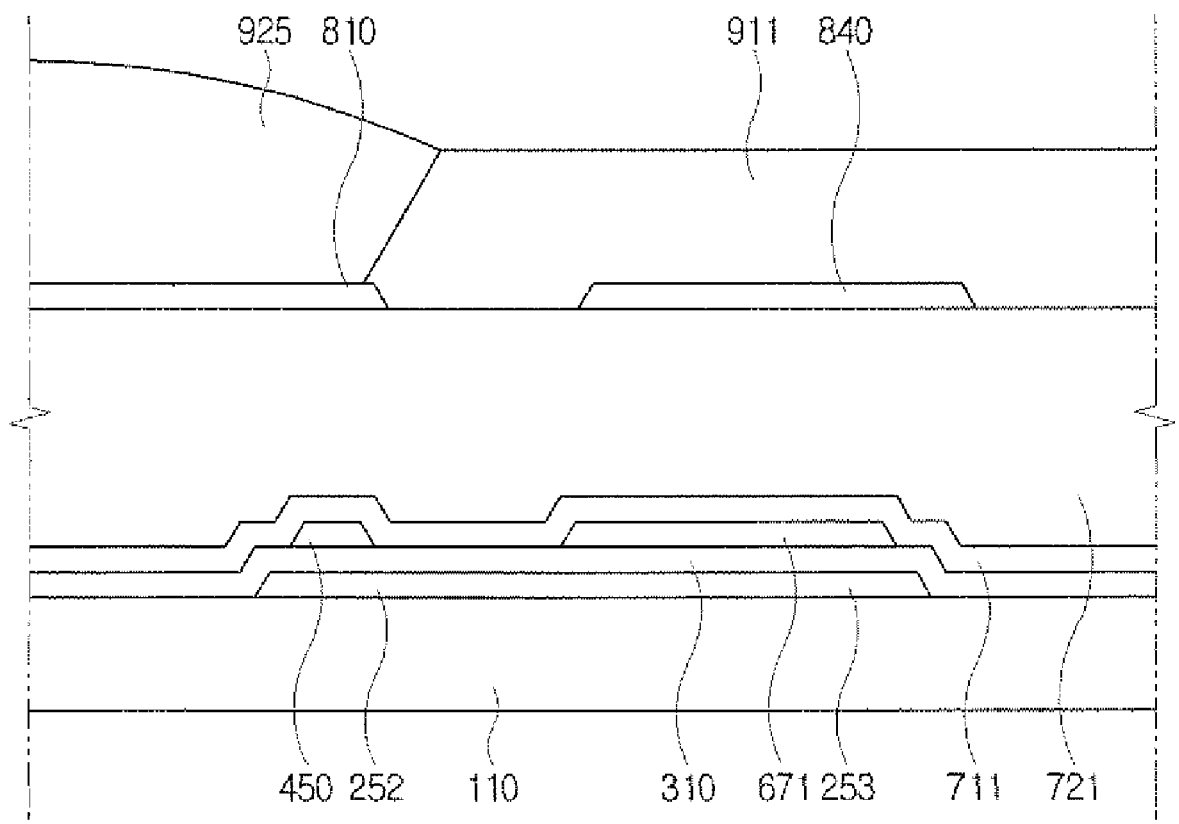

Next, as illustrated in FIG. 10A and FIG. 10B, in order to form the hole injecting layer 921, a hole injecting solution 925, which may be a polymer solution including a hole injecting material, may be formed on the pixel electrode 810 by the inkjet method. The hole injecting solution 925 may include a mixture of a polythiophene derivative such as poly(3,4-ethylenedioxythiophene) (PEDOT) and polystyrene sulfonic acid (PSS) and a polar solvent in which the mixture is dissolved. Glycol ethers such as isopropylalcohol (IPA), n-butanol, γ-butyrolatone, N-methylpyrrolidone (NMP), 1,3-dimethyl-2-imidazolidinone (DMI) and its derivative, carbitolacetate, and butylcarbitolacetate may be used as the polar solvent.

Drying may be performed in a nitrogen atmosphere at room temperature under pressure reduced to about 1 Torr. When the pressure is too low, the hole injecting solution 925 may be rapidly stopped. On the other hand, when the temperature is no less than the room temperature, the evaporation speed of the solvent increases so that it may be difficult to form a layer of uniform thickness.

Figure 11A:
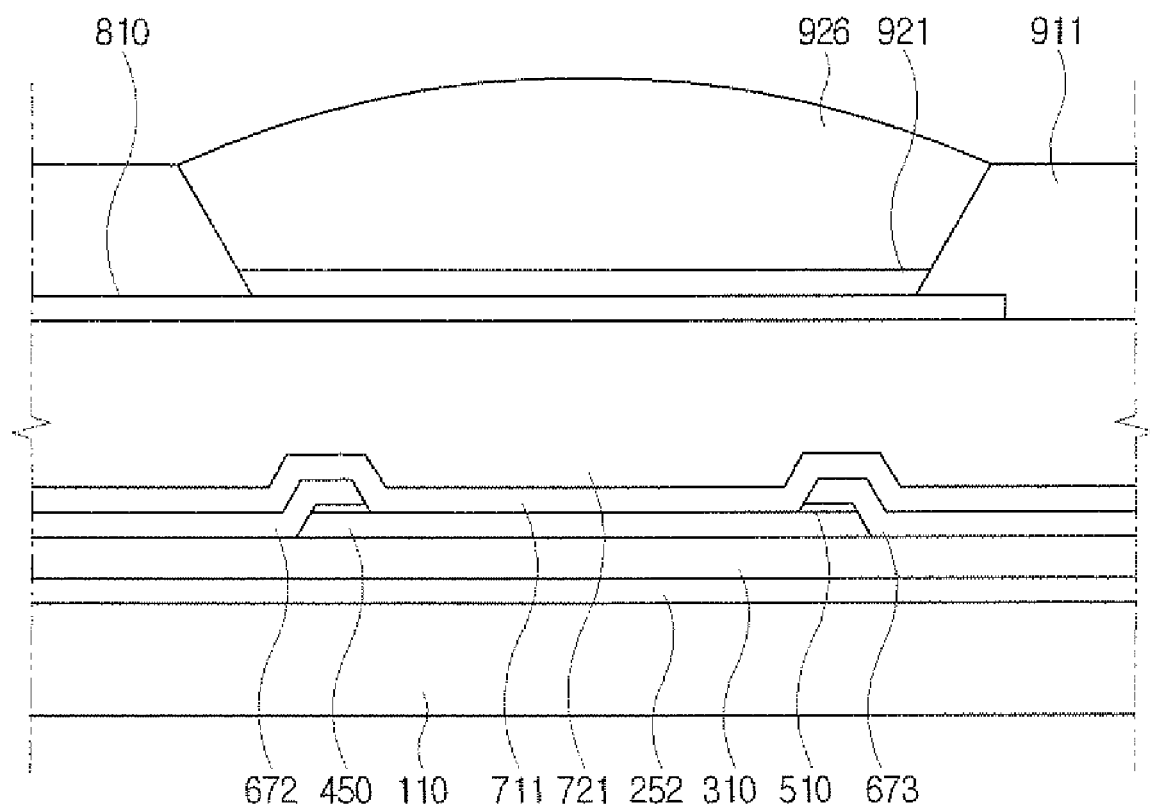
Figure 11B:
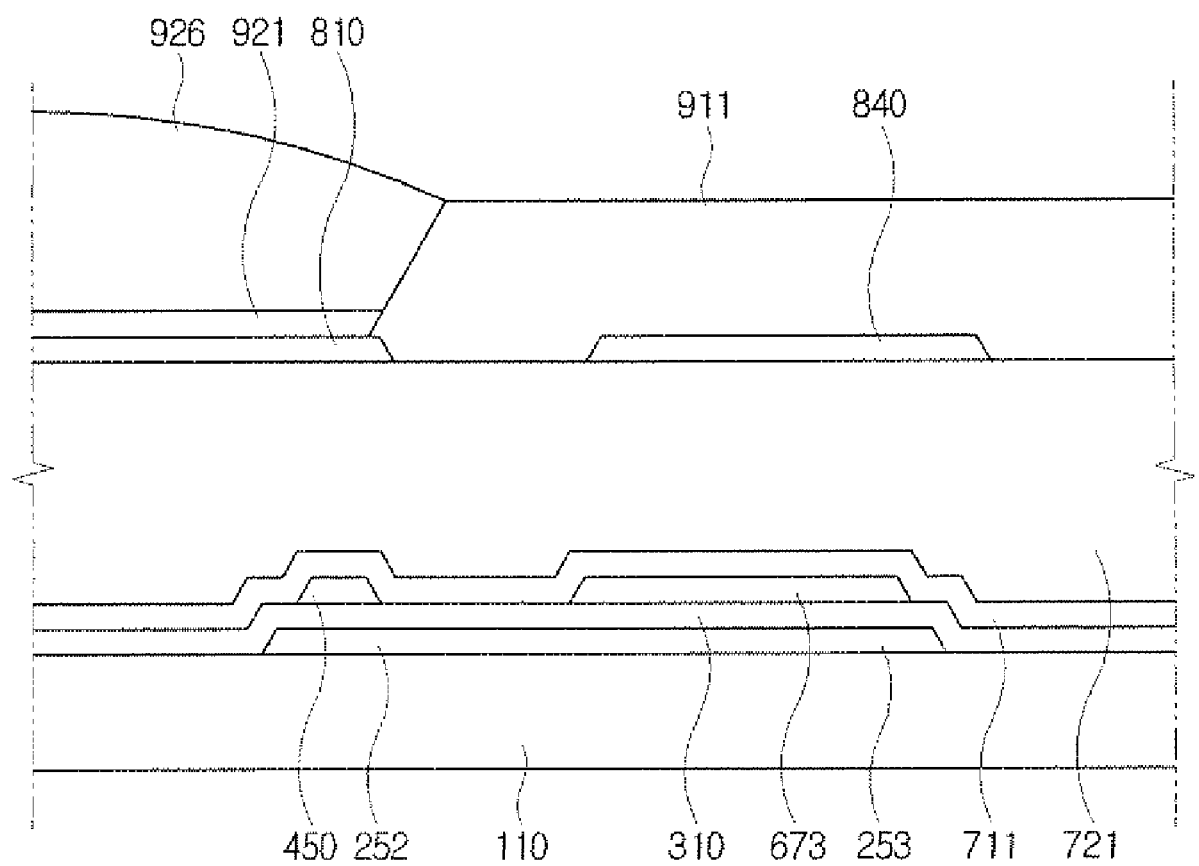

FIG. 11A and FIG. 11B illustrate the completed hole injecting layer 921. After completing the drying process, a thermal process may be performed under nitrogen, preferably, under vacuum at about 200° C. for 10 minutes. The thermal process removes solvent or water in the hole injecting layer 921. Then, in order to form the light emitting layer 922, a light emitting solution 926, such as a polymer solution that includes a light emitting material, may be formed on the pixel electrode 810 having the hole injecting layer 921.

A non-polar solution that does not dissolve in the hole injecting layer 921 may be used as the solvent of the light emitting solution 926 in order to prevent the hole injecting layer 921 from re-dissolving. The non-polar solution may include cyclohexylbenzene, dihydrobenzofuran, trimethylbenzene, and tetramethylbenzene.

On the other hand, since the affinity of the hole injecting layer 921 to the non-polar solvent may be low, when using the light emitting solution 926 including the non-polar solvent, it may not be possible to attach the hole injecting layer 921 and the light emitting layer 922 to each other and to uniformly apply the light emitting layer 922.

Therefore, in order to improve the affinity of the hole injecting layer 921 to the non-polar solvent, a process of reforming the surface of the hole injecting layer 921 may be performed before depositing the light emitting solution 926.

In the surface reforming process, after coating the hole injecting layer 921 with a surface reforming agent, the surface reforming agent is dried and evaporated. Cyclohexylbenzene, dihydrobenzofuran, trimethylbenzene, and tetramethylbenzene or toluene or xylene similar to the above solvents may be used as the surface reforming agent. The surface reforming agent may be applied by the inkjet method, the spin coating method, and a dip method.

The surface of the hole injecting layer 921 may be easily fused into the non-polar solvent through the surface reforming process so that it may be possible to uniformly apply the light emitting solution 926.

Then, after the light emitting solution 926 is dried, the light emitting layer 922 may be formed and the common electrode 930 may be formed on the light emitting layer 922 to complete the display device shown in FIG. 3 and FIG. 4.

Figure 12:
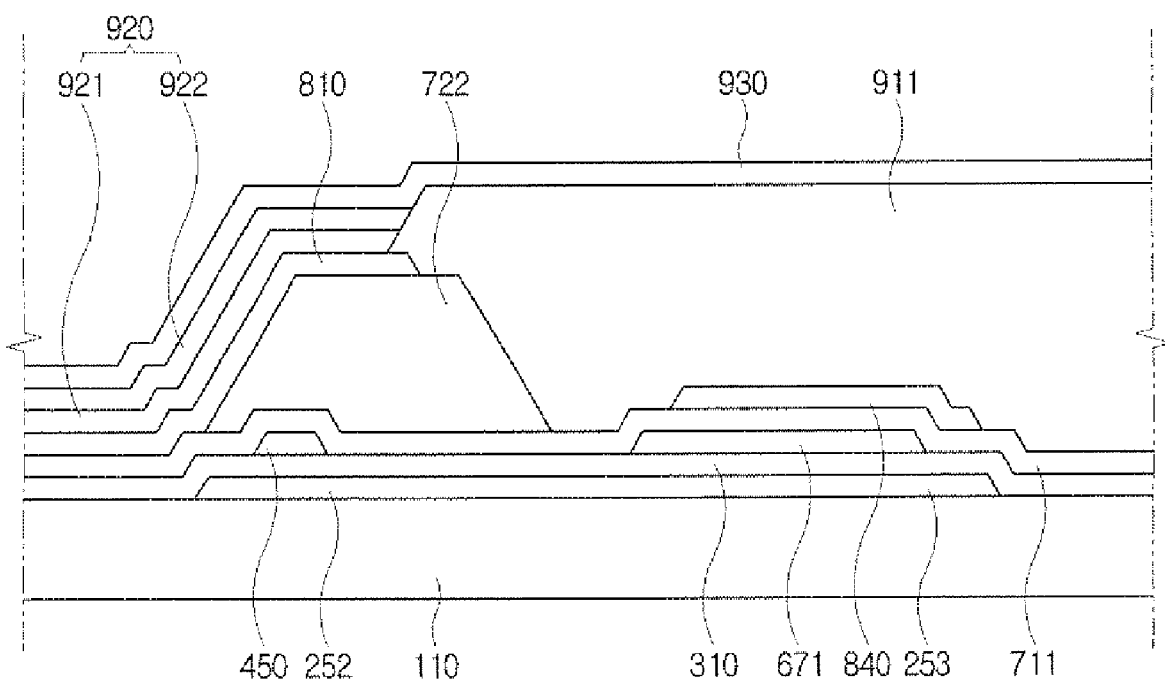
FIG. 12 is a sectional view of a display device according to a secondary exemplary embodiment of the present invention.

Hereinafter, a display device according to the second exemplary embodiment of the present invention will be described with reference to FIG. 12 based on the difference between the display device according to the first embodiment and the display device according to the second embodiment. FIG. 12 is a sectional view that corresponds to FIG. 3.

Referring to FIG. 12, the interlay insulating layer 722 is partially positioned on the passivation layer 711. More specifically, the interlayer insulating layer 722 is positioned only in the area corresponding to the photosensor semiconductor layer 450 so that the pixel electrode 810 may have less influence on the photosensor LS.

As described above, according to exemplary embodiments of the present invention, it is possible to provide a display device in which parasitic capacitance may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
    a substrate;
    a photosensor arranged on the substrate and comprising a semiconductor layer, an input terminal electrically connected to the semiconductor layer, and an output terminal electrically connected to the semiconductor layer;
    a first insulating layer arranged on the photosensor;
    a pixel electrode, an organic layer, and a common electrode layer sequentially arranged on the first insulating layer; and
    a controller that controls an input to the pixel electrode based on an output of the photosensor.

2. The display device of claim 1, wherein the semiconductor layer comprises amorphous silicon.

3. The display device of claim 1, wherein the photosensor further comprises an ohmic contact layer arranged between the semiconductor layer and the input terminal and between the semiconductor layer and the output terminal.

4. The display device of claim 1, further comprising a metal layer arranged between the semiconductor layer and the substrate, wherein the metal layer prevents external light from being incident on the semiconductor layer.

5. The display device of claim 4, further comprising a second insulating layer arranged between the metal layer and the semiconductor layer,
    wherein a negative voltage is applied to the metal layer.

6. The display device of claim 1, wherein a dielectric constant of the first insulating layer is less than or equal to 4.

7. The display device of claim 1, wherein the first insulating layer comprises one of fluorine-doped silicon oxide (SiOF), silicon oxycarbide (SiOC), and an organic material.

8. The display device of claim 7, wherein the organic material is one of benzocyclobutene (BCB), olefin, acrylic resin, polyimide, and fluoropolymer.

9. The display device of claim 1, wherein the first insulating layer is 1 µm to 5 µm thick.

10. The display device of claim 1, further comprising a passivation layer arranged between the semiconductor layer and the first insulating layer.

11. The display device of claim 10, wherein the passivation layer comprises silicon nitride.

12. The display device of claim 10, wherein the hole injecting layer comprises poly(3,4-ethylenedioxythiophene) and polystyrene sulfonic acid.

13. The display device of claim 1, further comprising a sensor transistor,
    wherein the input terminal of the photosensor is connected to a drain electrode of the sensor transistor.

14. The display device of claim 13, further comprising a sensor line,
    the sensor line being connected to a source electrode of the sensor transistor to apply a uniform voltage to the source electrode of the sensor transistor.

15. The display device of claim 1, further comprising a storage capacitor forming unit, the storage capacitor forming unit being integrally formed with the input terminal of the photosensor to form a sensor storage capacitor.

16. The display device of claim 15, further comprising:
    a sensor storage capacitor forming unit and a metal layer arranged between the substrate and the storage capacitor forming unit; and
    a second insulating layer arranged between the storage capacitor forming unit and the metal layer.

17. The display device of claim 16, further comprising a transparent electrode layer arranged on the storage capacitor forming unit, the transparent electrode layer being electrically connected to the metal layer,
    wherein the first insulating layer is arranged between the transparent electrode layer and the storage capacitor forming unit.

18. The display device of claim 1, further comprising gate lines and data lines crossing with each other,
    wherein the output terminal of the photosensor is electrically connected to a gate line.

19. The display device of claim 1, wherein the semiconductor layer is band shaped.

20. The display device of claim 1, wherein the organic layer comprises a hole injecting layer and a light emitting layer arranged on the hole injecting layer.

21. The display device of claim 20, wherein the light emitting layer comprises a polymer.

22. The display device of claim 1, wherein the input terminal is electrically connected to a first end of the semiconductor layer and the output terminal is electrically connected to a second end of the semiconductor layer, the first end and the second end being different ends of the semiconductor layer.

23. The display device of claim 1, wherein the display device is a bottom-emission display device.

* * * * *